United States Patent
Gödeke et al.

(10) Patent No.: US 10,153,389 B2
(45) Date of Patent: Dec. 11, 2018

(54) TELLURATE JOINING GLASS HAVING PROCESSING TEMPERATURES LESS THAN OR EQUAL TO 420° C

(71) Applicant: Ferro GmbH, Frankfurt am Main (DE)

(72) Inventors: Dieter Gödeke, Bad Soden a. T. (DE); Srinivasan Sridharan, Strongsville, OH (US)

(73) Assignee: Ferro GmbH, Frankfurt am Main (DE)

( * ) Notice: Subject to any disclaimer, the term of this patent is extended or adjusted under 35 U.S.C. 154(b) by 0 days.

(21) Appl. No.: 15/506,365

(22) PCT Filed: Sep. 28, 2015

(86) PCT No.: PCT/EP2015/072207
§ 371 (c)(1),
(2) Date: Feb. 24, 2017

(87) PCT Pub. No.: WO2016/050668
PCT Pub. Date: Apr. 7, 2016

(65) Prior Publication Data
US 2017/0243995 A1 Aug. 24, 2017

(30) Foreign Application Priority Data
Oct. 1, 2014 (DE) .................. 10 2014 014 322

(51) Int. Cl.
*C03C 8/04* (2006.01)
*C03C 8/24* (2006.01)
(Continued)

(52) U.S. Cl.
CPC .......... *H01L 31/0481* (2013.01); *C03B 23/24* (2013.01); *C03C 3/122* (2013.01);
(Continued)

(58) Field of Classification Search
CPC ..................................................... C03C 8/24
See application file for complete search history.

(56) References Cited

U.S. PATENT DOCUMENTS 4,945,071 A * 7/1990 Friesen ................... C03C 3/122
106/1.14
5,188,990 A * 2/1993 Dunnesnil ............... C03C 3/122
106/1.14
(Continued)

FOREIGN PATENT DOCUMENTS

CN     101164942 A    4/2008
EP      2525626 A1   11/2012
(Continued)

OTHER PUBLICATIONS

Espacenet bibliographic data for CN101164942 published Apr. 23, 2008, one page.
(Continued)

*Primary Examiner* — Karl E Group
(74) *Attorney, Agent, or Firm* — Rankin, Hill & Clark LLP

(57) ABSTRACT

The present invention relates to a glass, in particular a glass for the joining of glass panes for the production of vacuum insulating glasses at processing temperatures ≤420° C., to the corresponding composite glass, and to the corresponding glass paste. Moreover, the present invention relates to a vacuum insulating glass produced using the glass paste according to the invention, to the production process thereof, and to the use of the inventive glass and/or composite glass, and glass paste. The glass according to the invention is characterized in that it comprises the following components, in units of mol-%: $V_2O_5$ 5-58 mol-%, $TeO_2$ 40-90 mol-%, and at least one oxide selected from ZnO 38-52 mol-%, or $Al_2O_3$ 1-25 mol %, or $MoO_3$ 1-10 mol-%, or $WO_3$ 1-10 mol-%, or a combination thereof.

23 Claims, 1 Drawing Sheet

(51) Int. Cl.

| | |
|---|---|
| *H01L 31/048* | (2014.01) |
| *C03C 3/12* | (2006.01) |
| *C03C 8/02* | (2006.01) |
| *C03C 8/14* | (2006.01) |
| *C03C 8/16* | (2006.01) |
| *C03C 8/22* | (2006.01) |
| *C03C 17/00* | (2006.01) |
| *C03C 27/06* | (2006.01) |
| *C03C 27/08* | (2006.01) |
| *E06B 3/66* | (2006.01) |
| *E06B 3/677* | (2006.01) |
| *C03B 23/24* | (2006.01) |
| *E06B 3/673* | (2006.01) |
| *E06B 3/663* | (2006.01) |

(52) U.S. Cl.
CPC ............... *C03C 3/125* (2013.01); *C03C 8/02* (2013.01); *C03C 8/04* (2013.01); *C03C 8/14* (2013.01); *C03C 8/16* (2013.01); *C03C 8/22* (2013.01); *C03C 8/24* (2013.01); *C03C 17/007* (2013.01); *C03C 27/06* (2013.01); *C03C 27/08* (2013.01); *E06B 3/6612* (2013.01); *E06B 3/6775* (2013.01); *E06B 3/67334* (2013.01); *H01L 31/0488* (2013.01); *C03C 2207/00* (2013.01); *C03C 2217/452* (2013.01); *C03C 2217/475* (2013.01); *E06B 3/67326* (2013.01); *E06B 2003/66338* (2013.01); *Y02A 30/25* (2018.01); *Y02B 80/24* (2013.01)

(56) References Cited

U.S. PATENT DOCUMENTS

| | | |
|---|---|---|
| 8,551,368 B2 | 10/2013 | Nakamura et al. |
| 9,257,578 B2 | 2/2016 | Wang et al. |
| 2009/0232425 A1 | 9/2009 | Tai et al. |
| 2010/0180934 A1 | 7/2010 | Naito et al. |
| 2012/0213952 A1 | 8/2012 | Dennis |
| 2014/0008587 A1 | 1/2014 | Yoshida et al. |
| 2014/0145122 A1 | 5/2014 | Sawai et al. |
| 2015/0303325 A1* | 10/2015 | Song .................. H01B 1/22 252/512 |

FOREIGN PATENT DOCUMENTS

| | | | |
|---|---|---|---|
| JP | 2004-356394 A | | 12/2004 |
| JP | 2007182347 A | * | 7/2007 |
| JP | 2011-79694 A | | 4/2011 |
| JP | 2013-103840 A | | 5/2013 |
| SU | 552311 | * | 5/1977 |

OTHER PUBLICATIONS

Espacenet bibliographic data for JP2004356394 published Dec. 16, 2004, two pages.

International Search Report for corresponding PCT/EP2015/072207 dated Dec. 23, 2015, three pages.

Epacenet bibliographic data for JP2011079694 published Apr. 21, 2011, one page.

Nang et al., "Investigation of the melting characteristic, forming regularity and thermal behavior in lead-free $V_2O_5$—$B_2O_3$—$TeO_2$ low temperature sealing glass," Materials Letters 67 (2012) pp. 196-198.

International Preliminary Report on Patentability for corresponding PCT/EP2015/072207 dated Apr. 13, 2017, nine pages.

Espacenet bibliographic data for JP2013103840 published May 30, 2013, one page.

Terny et al., "Electrical response of bivalent modifier cations into a vanadium-tellurite glassy matrix," Journal of Non-Crystalline Solids, vol. 387, Jan. 2014, pp. 107-111.

Mazurin et al., Physical Sciences Data 15, Handbook of Glass Data, Park D ternary non-silicant glasses, Elsevier Science Publishers B.V., Jun. 14, 1991, pp. 844-863.

Mazurin et al., Physical Sciences Data 15, Handbook of Glass Data, Part D ternary non-silicate glasses, Elsevier Science Publishers B.V., Jun. 14, 1991, pp. 872-880.

\* cited by examiner

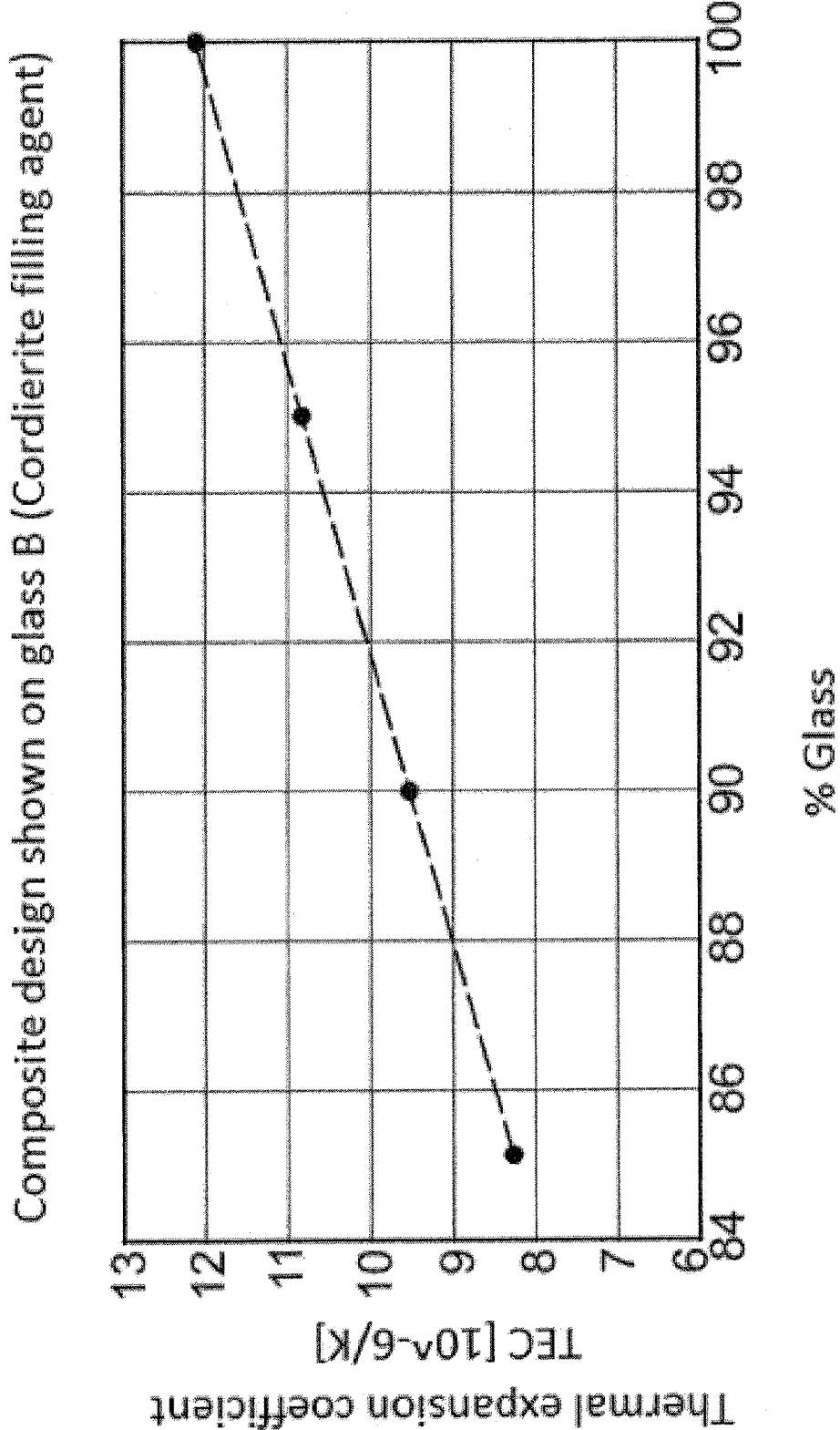

TELLURATE JOINING GLASS HAVING PROCESSING TEMPERATURES LESS THAN OR EQUAL TO 420° C

The present invention relates to a glass, in particular a glass for the joining of glass panes for the production of vacuum insulating glasses at processing temperatures ≤420° C., to the corresponding composite glass, and to the corresponding glass paste.

Moreover, the present invention relates to a vacuum insulating glass produced using the glass paste according to the invention, to the production process thereof, and to the use of the inventive glass and/or composite glass, and glass paste.

PRIOR ART

Glasses that are used to connect objects made of glass, ceramic, and metal parts, are glasses having particularly low softening temperatures. They are also referred to as glass solder or joining glasses. The term, "joining", shall be understood to refer to the correct contacting or connecting of work-pieces by appropriate processes (welding, rolling, soldering, etc.).

Glass solders or joining glasses are described comprehensively in the prior art. Joining glasses are used, in particular, in the field of semiconductors, in high temperature fuel cells or in solar cell applications. In contrast, the use of joining glasses in the production of vacuum insulating glass panes has been described only rarely thus far.

Vacuum insulating glasses are known and already commercially available. In vacuum insulating glasses, the intervening space between the two individual panes is evacuated. In contrast, the intervening space between the glass panes is usually filled with a noble gas in conventional insulating glass. Moreover, the intervening space between the two individual panes is significantly smaller in vacuum insulating glass because of the absence of convection. The individual panes are usually kept at a distance from each other by so-called spacers, which are arranged like a grid distributed over the surface of the glass, to prevent the external air pressure from compressing the two individual panes, and are connected to each other across the entire circumference by means of an edge seal.

Usually, vacuum insulating glass panes are produced by placing spacers on the first individual glass pane and affixing them, followed by placing the second individual glass pane. The second individual glass pane comprises, on its edge, a bore hole with evacuation sockets for subsequent evacuation. The two glass panes are connected along their edges, for example by means of glass solder.

Tellurium-containing glasses are used not only as fiber materials and in conductive contacting pastes for solar cells, but also as optical amplifiers in Er-doped fiber amplifiers in so-called WDM (wavelength division multiplexing). In contrast, they are largely unknown in the field of solder glasses and joining glasses. In particular, they have not been described for use for the production of vacuum insulating glasses.

The tellurium glass family has excellent properties with regard to glass formation and low melting temperatures that are not attained by other conventional glasses.

U.S. Pat. No. 5,188,990 describes tellurium-vanadate glasses for semiconductor applications (so called Cer-Dip packages). Joining partners are ceramics: aluminum oxide. The glass composition consists essentially of $TeO_2$ and $V_2O_5$ and oxides selected from the group consisting of $Nb_2O_5$, $ZrO_2$ and ZnO, $Bi_2O_3$ and CuO and $P_2O_5$ and $Ta_2O_5$ and, further, up to 10% oxides of zinc, cadmium, barium, tungsten, molybdenum, and titanium. Moreover, the glasses described herein comprise no aluminum oxide and the expansion coefficient is in the range of 14-18 $10^{-6}$/K. The high expansion coefficient is disadvantageous for application of a glass/glass joining since it requires the use of a higher filing agent content. Moreover, the filling agents used here, including niobium pentoxide, are disadvantageous. A glass/glass joining has not been investigated.

WO2013/043340A1 owned by Guardian describes high vanadium-containing joining glasses for the production of vacuum insulating glass panes. The main components are vanadium oxide, barium oxide, and zinc oxide. The glasses used in this context have a very high vanadium content (in the range of 50-60 wt.-%), and contain no or very small amounts of tellurium oxide. These glasses are chemically less resistant and more susceptible to crystallization.

The $V_2O_5$—$B_2O_3$—$TeO_2$ glasses described by F. Wang et al., Materials Letters 67, 196-198 (2012) differ from the present invention by their content of boron oxide. The present invention comprises boron oxide-free glasses. Moreover, the study evidences that the glasses from the system, in part, have a pronounced tendency to crystallize (below 420° C.).

U.S. Pat. No. 8,551,368B2 describes tellurium-containing glasses for application in solar cell contacting pastes. The paste described therein comprises silver as main component, a glass frit, and an organic substrate, whereby the glass frit contains tellurium oxide as network-forming component, and, further, tungsten oxide and molybdenum oxide. The glasses described presently differ chemically by their content of tungsten oxide ($WO_3$) and the absence of vanadium pentoxide.

US2010/0180934A1 describes a glass composition with low softening point for electronic components that is essentially free of lead, bismuth, and antimony. The vanadium oxide content is 40-65 percent by weight and the tellurium content of 20-30 percent by weight is relatively low.

CN101164942A discloses a lead-free tellurate glass made of tellurium oxide and vanadium oxide, in which small amounts of zinc oxide or aluminum oxide may be present.

US2014/008587A1 describes a conductive paste that comprises a glass frit that comprises tellurium as network-forming component in an amount of 35 to 70 mol-%, relative to the oxide. In addition, silver is present in an amount of 3 to 40 mol-%, relative to the oxide, and tungsten and molybdenum can be present as well. The addition of vanadium oxide is not mentioned specifically JP 2004356394A describes a sealing material that contains a glass component that can contain, aside from vanadium pentoxide and tellurium dioxide, up to 10% zinc oxide and small amounts of aluminum oxide.

The production methods for vacuum insulating glass panes of the prior art are subject to certain limitations. One particular disadvantage, in part, is the very high joining temperature.

Currently, joining temperatures of less than 420° C. are attained only with high lead-containing joining glasses whose chemical resistance cannot be considered to be sufficient and which impede a global market launch for environmental reasons. Bismuth-containing glasses fail in application, since these glasses are very crystallization-sensitive and the softening commences above 420° C. Moreover, their flow properties are strongly impaired by the addition of filling agents, which reduces the wettability of the glasses by their composite material.

OBJECT OF THE INVENTION

It is the object of the invention to devise a joining material that enables the joining of glass panes for the production of vacuum insulating glasses at temperatures ≤420° C. and preferably ≤400° C. Moreover, the joining material should be free of lead.

DETAILED DESCRIPTION OF THE INVENTION

FIGURE shows the thermal expansion coefficient (TEC) of glass B with content of glass.

The object was met by providing a glass, in particular joining glass, that comprises the following components, in units of mol-%:

| $V_2O_5$ | 5-58 mol-%, |
| $TeO_2$ | 40-90 mol-%, and |
| at least one oxide selected from | |
| ZnO | 38-52 mol-%, or |
| $Al_2O_3$ | 1-25 mol-%, or |
| $MoO_3$ | 1-10 mol-%, or |
| $WO_3$ | 1-10 mol-%, |
| or a combination thereof. | |

Preferably, the glass comprises the following components, in units of mol-%:

| $V_2O_5$ | 5-37 mol-%, |
| $TeO_2$ | 40-70 mol-%, and |
| at least one oxide, selected from | |
| ZnO | 38-52 mol-%, or |
| $Al_2O_3$ | 6-25 mol-%, or |
| $MoO_3$ | 1-10 mol-%, or |
| $WO_3$ | 1-10 mol-%, |
| or a combination thereof. | |

Further the glass comprises preferably the following components, in units of mol-%:

| $V_2O_5$ | 5-35 mol-%, |
| $TeO_2$ | 40-70 mol-%, and |
| at least one oxide selected from | |
| ZnO | 38-52 mol-%, or |
| $Al_2O_3$ | 6-25 mol-%, or |
| $MoO_3$ | 1-10 mol-%, or |
| $WO_3$ | 1-10 mol-%, |
| or a combination thereof. | |

The requirements profile of a joining glass/composite as solder for vacuum insulating glass panes is as follows:
- Joining temperature ≤420° C.
- Thermal expansion coefficient of the composite glass (joining glass+filling agent) in the range of 7.0-8.5 $10^{-6}$/K
- Compatibility with standard filling agents: Cordierite (EG0225), beta eukryptite, in the range of 1-25 wt-%
- Glass starts to soften >300° C. (start of softening >300° C. is required in order to ensure sufficient binder burn out of the glass with standard media.)
- No crystallization of the glasses in powdered form in the range of 300-420° C.
- Moisture resistance, low solubility in water
- Good bonding of the glass on float glass (on both bath side and air side),
- Compatibility of the glass with standard solvents BDG, DPM
- Processability when exposed to air
- Processability by rapid heating ramps and cooling ramps
- Lead-free, cadmium-free
- Provision of a hermetic, low-tension glass/glass composite
- Industrial processing by dispensing, digital printing technique, screen printing, etc. is feasible Due to the low joining temperature, even thermally pre-tensioned glass panes can be joined without losing their pre-tension. The relatively low joining temperatures also allow coated float glasses to be processed without any damage to the coating (low-E) of the glasses. This makes a simpler design easier, since weight can be saved through the use of thinner panes. Other applications in the field of conductive glass pastes (solar cell applications), as additives for auto glass paints such as silver bus bar hiding, are also conceivable.

Preferably, the glass composition contains a mixture of ZnO and $Al_2O_3$. However, it is also of advantage if just one component of zinc oxide or aluminum oxide is present:

Accordingly, the following glass composition is preferred:

| $V_2O_5$ | 6-33 mol-%, |
| $TeO_2$ | 42-57 mol-%, and |
| at least one oxide selected from | |
| ZnO | 38-52 mol-%, or |
| $Al_2O_3$ | 6-25 mol-%, |
| or a combination thereof. | |

The following glass composition is particularly preferred:

| $V_2O_5$ | 32.7 mol-%, |
| $TeO_2$ | 56.3 mol-%, and |
| $Al_2O_3$ | 11.0 mol-%. |

It is also preferred if an amount of 1-10 mol-% of molybdenum oxide and/or tungsten oxide is used aside from $V_2O_5$ and $TeO_2$.

The glass preferably has a glass transition temperature (Tg) in the range of 260-380° C.

Moreover, it has also been evident that doping the glass with up to 20 wt-% of aluminum oxide ($Al_2O_3$) particles, preferably up to 10 wt-%, has an advantageous effect on the further crystal growth of Al-containing crystals in the glass matrix.

Likewise, doping with oxides such as $Cr_2O_3$, $Fe_2O_3$, $Ga_2O_3$ or ZnO, or doping with aluminum oxide ($Al_2O_3$) particles doped with the oxides specified above has a beneficial effect.

Referring to the doping, it has been evident that it is preferred to use the corundum structure of aluminum oxide. But other modifications of aluminum oxide such as γ-, δ-, κ-, ρ-$Al_2O_3$ can be used just as well.

The average grain size (d50) of $Al_2O_3$ is 5-90 μm. Preferred ranges are 5-20 μm.

In addition to aluminum oxide and the further oxides mentioned above, the use of other materials, such as mullite ($3Al_2O_3.2SiO_2$), gahnite ($ZnO.Al_2O_3$) or $Al(OH)_3$ such as boehmite, bayerite, and gibbsite, can be taken into consideration as well.

The glass according to the invention can also comprise a second glass. Although it was mentioned above that it is preferable to use lead-free glasses, in particular for vacuum insulating glasses, lead-containing glasses can well be conceivable as second glass for other applications.

Accordingly, the second glass is another Te-glass or V-glass or Bi-glass or Zn-glass or Ba-glass or alkali-Ti-silicate glass or a lead glass or a combination thereof.

A further aspect of the invention is a composite glass that comprises a filling agent in addition to the glass according to the invention.

The amount of said filling agent is in the range of 1-25 wt-% and it preferably has an average grain size (d50) of 5-30 μm. The grain size is preferred to be 10-25 μm and most preferred to be 20 μm. Mixtures of two or more grain size distributions (coarse: d50=15-25 μm and fine: d50=1-10 μm) can be used in order to obtain said preferred range.

The filling agent is selected from zirconyl phosphates, dizirconium diorthophosphates, zirconium tungstates, zirconium vanadates, $Zr_2(WO_4)(PO_4)_2$, aluminum phosphate, cordierite, eukryptite, keatite, $(Hf,Zr)(V,P)_2O_7$, $NaZr(PO_4)_3$, alkaline earth zirconium phosphates such as $(Mg,Ca,Ba,Sr)Zr_4P_5O_{24}$, either alone or in combination.

A filling agent amount in the range of 20-25 wt-% is preferred.

It should be noted in this context that the thermal expansion coefficient can be controlled in specific manner by means of the added amount of filling agent. This is illustrated in more detail below using exemplary embodiment B.

Moreover, a subject matter of the invention is a glass paste that is produced from the glass according to the invention or the composite glass according to the invention by means of a screen printing medium. Preferably, the glass paste comprises a binding agent. It is preferred to use a polypropylene carbonate for this purpose.

Another subject matter of the invention is a method for the production of a vacuum insulating glass. In the method shown presently, the glass solder according to the invention is used in the form of a paste, although this is shown for exemplary reasons only. Alternatively, the glass solder itself and/or the composite material can be used for the production of a vacuum insulating glass.

The method is characterized by the following steps of:
Applying the glass paste according to claims 15-16 onto a glass substrate;
drying the paste on the glass substrate for 10 minutes at a temperature of 130° C.;
heating the glass substrate to a temperature of 300° C. for 30-60 minutes;
firing to a joining temperature of 325-390° C. for 1-5 minutes;
cooling to room temperature;
applying a second glass substrate;
firing to a joining temperature of 325-390° C. for 10-15 minutes; and
cooling to room temperature.

The firing can involve various heating processes, such as broadband IR or visible light heating, laser light heating, induction heating or microwave heating.

A further subject matter of the invention is the vacuum insulating glass produced by means of the method described above.

The glass solder according to the invention, the composite glass according to the invention, and the glass paste according to the invention are used as joining material for glass panes for the production of vacuum insulating glasses.

Moreover, as described above, the glass according to the invention and/or the composite glass according to the invention can be added, as admixture, to another basic flow, e.g. a bismuth-containing frit, in order to lower the melting point.

Moreover, the glass solder according to the invention, the composite glass according to the invention, and the glass paste according to the invention can be used as joining material for solar cell applications, such as encapsulating solar cells on the basis of silicon and/or silicon-organic systems and thin layers, encapsulating other electronic devices, such as organic LEDs (OLED), for windows, and as additives for auto glasses and auto glass paints.

The use as a joining material for joining applications for micro-electromechanical systems (MEMS) is also conceivable. Moreover, a use as low temperature joining materials for sensors or a use in thick layer applications, in particular as sintering aid for conductive pastes and as overglaze pastes, is conceivable as well.

The following raw materials can be used for production of the joining glasses:
Tellurium oxide powder 75-80% d50=3-10 μm
Vanadium pentoxide $V_2O_5$ 95-99%: no ammonium vanadate
Calcinated aluminum oxide (technical quality)
Zinc oxide 99.9% (technical quality)
Molybdenum oxide (technical quality)
Tungsten oxide (technical quality)

The raw materials are mixed well in a planetary mixer, wing mixer, etc., and are melted in a ceramic crucible made of refractive material on air at 650-750° C. in an electrical furnace.

The low melting temperatures are required in order to prevent evaporation of the $TeO_2$. An oxidizing melt procedure is required, but no $O_2$ bubbling.

The quenching can be done in water or, optionally, on water-cooled rollers. The glass has a reddish, brown black color. Due to the low viscosity of the glass, quenching of the glass on a roller is not trivial. In this context, it is recommended to cast at temperatures of approx. 650° C. In order to prevent subsequent re-fusion of the glass, the use of doubly-rotating rollers is recommended.

Subsequently, the quenched frit is ground to grain sizes d90≤60 μm using ball mills, jet mills, etc. The thermal expansion coefficient (TEC) is adjusted, optionally, by adding a ceramic filling agent already during the grinding or in a concluding mixing step.

For glass production, the glass is processed to a paste using a three-roll mill and screen printing medium 801022 or 801026.

Preferably, the glass can be processed using a binding agent made of polypropylene carbonate (e.g. QPac 40 binder, from: Empower Materials, USA). Said binding agent is advantageous in that it decomposes already at temperatures in the range of 250-300° C., which ensures that no carbon residues remain enclosed in the joining glass.

The glasses are then applied onto the glass substrate by means of a dispenser: h=0.3-0.5 mm, b=4-6 mm, and the paste is dried with the float glass for 10 minutes at 130° C.

Ideally, the glass solder-coated float glass pane is heated to a temperature of 300° C. in a furnace and maintained at this temperature for 30-60 minutes, then fired to the joining temperature of 325-390° C., maintained at this temperature for 1-5 minutes, and cooled to room temperature again. In a second process step, the second float glass pane can be placed on the pre-coated float glass pane and can be affixed mechanically by means of clamps. Spacers between the panes provide for a uniform solder height. In the subsequent firing cycle, the composite is heated directly to the joining temperature of 325-390° C. and maintained at this temperature for 10-15 minutes. Finally, the composite is cooled to room temperature again. This procedure ensures that the composite is largely free of pores, since the binding agent was previously burned off at 300° C.

The invention is described in the following on the basis of examples, which do not limit the invention in any form or shape.

Exemplary Embodiments

TABLE 1 shows the chemical composition and physical properties of the glasses

|  | A | B | C | D | E | F | G |
|---|---|---|---|---|---|---|---|
| Composition [mol %] |  |  |  |  |  |  |  |
| TeO$_2$ | 49.3 | 56.3 | 54.4 | 44.2 | 42.6 | 60.6 | 57.5 |
| V$_2$O$_5$ | 11.2 | 32.7 | 27.3 | 10.9 | 6.7 | 30.4 | 36.1 |
| ZnO | 39.5 |  |  |  | 38.6 | 50.7 |  |
| Al$_2$O$_3$ |  | 11.0 | 18.3 | 6.3 |  |  | 6.4 |
| WO$_3$ |  |  |  |  |  | 9 |  |
| DSC |  |  |  |  |  |  |  |
| Tg [° C.] | 327 | 298 | 302 | 322 | 373 | 272 | 270 |
| Softening point [° C.] | 380 | 337 | 334 | 394 | 417 | 311 | 302 |
| TMA-Thermal expansion coefficient |  |  |  |  |  |  |  |
| 50_250 [10$^{-6}$/K] | 12 | 12.8 | 12.1 | 12.4 | 12.9 |  |  |
| 50_200 [10$^{-6}$/K] | 12.3 | 12.3 | 11.9 | 12.1 | 12.5 | 14.5 | 13.5 |

FIGURE shows that it is feasible to variably adapt the expansion coefficient (TEC) of the glasses. The special feature in this context is that the glasses tolerate high filling agent contents without deterioration of the wetting properties. Whereas the flow properties of high bismuth-containing glasses are clearly reduced already at filling agent contents of 5 wt-%, the glasses described presently allow expansion coefficients of less than 8.10/K to be attained without difficulty without suffering any loss of wettability.

Chemical Resistance in Boiling Water:

2 g sample, example B (d50 approx. 6 µm, d90<50 µm) was weighed into a 50-mL volumetric flask, fully deionized water was added to the mark, and this was homogenized. Subsequently, the volumetric flasks were exposed to a temperature of 98±0.5° C. in a heating bath for 60 min. After cooling, renewed homogenization, topping up to the mark, and a sedimentation period (20 min), the sample was filtered through a 0.45 µm filter.

Solubility in water [%]=0.4

The invention claimed is:

1. A joining glass comprising the following components in units of mol-%:

| V$_2$O$_5$ | 5-54 mol-%, |
|---|---|
| TeO$_2$ | 40-89 mol-%, and |
| at least one oxide selected from the group consisting of | |
| ZnO | 38-52 mol-%, |
| Al$_2$O$_3$ | 6-25 mol-%, and | a combination thereof.

2. The glass according to claim 1, wherein the glass includes in units of mol-%:

| V$_2$O$_5$ | 6-33 mol-%, |
|---|---|
| TeO$_2$ | 42-57 mol-%, and |
| at least one oxide selected from the group consisting of | |
| ZnO | 38-52 mol-%, |
| Al$_2$O$_3$ | 6-25 mol-%, | and
a combination thereof.

3. The glass according to claim 1, wherein the glass includes in units of mol-%:

| V$_2$O$_5$ | 32.7 mol-%, |
|---|---|
| TeO$_2$ | 56.3 mol-%, and |
| Al$_2$O$_3$ | 11.0 mol-%. |

4. The glass according to claim 1, wherein the glass has a glass transition temperature (Tg) in the range of 260-380° C.

5. The glass according to claim 1, wherein the glass is doped with up to 20 wt % additional Al$_2$O$_3$ particles.

6. The glass according to claim 1, wherein the glass is further doped with at least one additional oxide selected from the group consisting of Cr$_2$O$_3$, Fe$_2$O$_3$, Ga$_2$O$_3$ and ZnO, or with additional Al$_2$O$_3$ particles doped with said at least one additional oxide.

7. The glass according to claim 5, wherein the average grain size (d50) of Al$_2$O$_3$ is 5-90 µm.

8. A composite glass comprising a glass according to claim 1 and 1 to 25 wt-% of at least one filling agent selected from the group consisting of zirconyl phosphates, dizirconium diorthophosphates, zirconium tungstates, zirconium vanadates, Zr$_2$(WO$_4$)(PO$_4$)$_2$, aluminum phosphate, cordierite, eucryptite, keatite, (Hf,Zr)(V,P)$_2$O$_7$, NaZr(PO$_4$)$_3$ and alkaline earth zirconium phosphate.

9. The composite glass of claim 8, wherein the average grain size (d50) of the filling agent is 5-30 µm.

10. A glass paste, comprising the glass of claim 1 and a screen printing medium.

11. A glass paste, comprising the composite glass of claim 8 and a screen printing medium.

12. A vacuum insulating glass comprising the glass of claim 1.

13. A vacuum insulating glass comprising the composite glass of claim 8.

14. An electrical or electronic device comprising the glass of claim 1, wherein the electrical or electronic device is selected from the group consisting of sensors and electromechanical systems.

15. An automotive glass or glass paint comprising the glass of claim 1.

16. A vacuum insulating glass comprising at least two glass substrates joined by the glass of claim 1 to define a cavity, wherein said cavity contains at least one solar cell.

17. A process for producing a vacuum insulating glass, comprising:
   applying the glass paste of onto a glass substrate,
   drying the paste on the glass substrate for 10 minutes at a temperature of 130° C.,
   firing the glass substrate to a temperature of 300° C. for 30-60 minutes,
   firing to a joining temperature of 325-390° C. for 1-5 minutes,
   cooling to room temperature,
   attaching a second glass substrate,
   firing to a joining temperature of 325-390° C. for 10-15 minutes and
   cooling to room temperature.

18. The process of claim 17, wherein the firing is carried out by at least one selected from the group consisting of broadband IR heating, visible light heating, laser light heating, induction heating and microwave heating.

19. The glass according to claim 1, wherein the glass includes in units of mol-%:

| | |
|---|---|
| $V_2O_5$ | 5-37 mol-%, |
| $TeO_2$ | 40-70 mol-%, and |
| at least one oxide selected from the group consisting of | |
| ZnO | 38-52 mol-%, |
| $Al_2O_3$ | 6-25 mol-%, and | a combination thereof.

20. The glass according to claim 1, wherein the glass includes in units of mol-%:

| | |
|---|---|
| $V_2O_5$ | 5-35 mol-%, |
| $TeO_2$ | 40-70 mol-%, and |
| at least one oxide selected from the group consisting of | |
| ZnO | 38-52 mol-%, |
| $Al_2O_3$ | 6-25 mol-%, and | a combination thereof.

21. The glass according to claim 1, wherein the glass includes in units of mol-%:

| | |
|---|---|
| $V_2O_5$ | 27.3 mol-%, |
| $TeO_2$ | 54.4 mol-%, and |
| $Al_2O_3$ | 18.3 mol-%. |

22. A joining glass comprising the following components in units of mol-%:

| | |
|---|---|
| $V_2O_5$ | 5-37 mol-%, |
| $TeO_2$ | 40-70 mol-%, |
| $Al_2O_3$ | 6-25 mol-%, and |
| $MoO_3$ | 1-10 mol-%. |

23. The glass according to claim 22, wherein the glass includes in units of mol-%:

| | |
|---|---|
| $V_2O_5$ | 5-35 mol-%, |
| $TeO_2$ | 40-70 mol-%, |
| $Al_2O_3$ | 6-25 mol-%, and |
| $MoO_3$ | 1-10 mol-%. |

* * * * *